US005258574A

United States Patent [19]

Kawano

[11] Patent Number: 5,258,574

[45] Date of Patent: Nov. 2, 1993

[54] TONE GENERATOR FOR STORING AND MIXING BASIC AND DIFFERENTIAL WAVE DATA

[75] Inventor: Yasuhiro Kawano, Hamamatsu, Japan

[73] Assignee: Yamaha Corporation, Hamamatsu, Japan

[21] Appl. No.: 792,290

[22] Filed: Nov. 14, 1991

[30] Foreign Application Priority Data

Nov. 16, 1990 [JP] Japan ................................ 2-312145

[51] Int. Cl.[5] ........................ G10H 5/00; G10H 1/12; H03H 7/01

[52] U.S. Cl. ........................................ 84/661; 84/604; 84/DIG. 9; 84/629

[58] Field of Search ................. 84/603, 625, 660, 699, 84/604, 629, 661, DIG. 9

[56] References Cited

U.S. PATENT DOCUMENTS 4,181,059 1/1980 Weber ..................... 84/DIG. 12 X
4,536,853 8/1985 Kawamoto et al. .
5,233,352 7/1991 Kellogg et al. ...................... 84/658

*Primary Examiner*—William M. Shoop, Jr.
*Assistant Examiner*—Jeffrey W. Donels
*Attorney, Agent, or Firm*—Spensley Horn Jubas & Lubitz

[57] ABSTRACT

A tone generator comprises a basic wave memory for storing a first basic wave data of a musical tone signal, a differential wave memory for storing differential wave data between the first basic wave data and a second basic wave data which is different form the first basic wave data, and mixing device for mixing the first basic wave data and the differential wave data. The musical tone signal is produced by using the mixing device which mixes the basic wave data and the differential wave data without using directly stored sampling data memory. Further a multiplier for multiplying said differential wave data by random factors is provided, the random factors being distributed with normalized probability, resulting in that wave data not only varying tone color at random, but also resembling as a whole the basic wave tone color can be obtained.

9 Claims, 8 Drawing Sheets

TONE GENERATOR FOR STORING AND MIXING BASIC AND DIFFERENTIAL WAVE DATA

BACKGROUND OF THE INVENTION

1. Field of the Invention

The present invention relates to a tone generator having a wave data memory, more particularly, to, a sampling type tone generator having a wave data memory storing sampling data of tones.

2. Description of the Prior Art

In conventional tone generators having the sampling type tone generator, there have been the following methods to obtain wave data of a great number of tone colors.

1) Obtain any tone color by interpolation between two or more wave data in a wave data memory.

2) Obtain any tone color by arrangement of two or more wave data each of which is slightly different toward time axis.

3) Obtain any tone color by modification of a mixing rate and envelope data when two or more wave data are mixed after multiplication of the envelope data.

4) Obtain any tone color by changing factors of a filter when wave data is filtered by the filter.

However, the methods 1) and 2) have waste of memory. Method 3) has the advantage in getting great tone changes, however, it is difficult for the method to generate subtle tone change. Also, method 4) has the disadvantage of limitation in getting natural feeling.

SUMMARY OF THE INVENTION

It is therefore an object of the present invention to provide a tone generator which can resolve the above mentioned inconveniences by mixing a basic wave and a differential wave.

In accordance with the present invention, a tone generator comprises a basic wave memory for storing a first basic wave data of a musical tone signal; a differential wave memory for storing differential wave data between the first basic wave data and a second basic wave data which is different form the first basic wave data; mixing means for mixing the first basic wave data and the differential wave data; and output means for outputting data mixed by the mixing means.

The tone generator outputs wave data which can be obtained by mixing basic wave data stored in a basic wave memory and differential wave data stored in a differential wave memory. The differential wave data corresponds to the difference between the basic wave data and another basic wave data which is slightly different from the former basic wave data, so that if the former and latter basic wave data are similar, the output wave data is subtle different from the former and the latter basic wave data. That is, delicately varying wave data as compared to the above basic wave data can be obtained.

DETAILED DESCRIPTION OF THE PREFERRED EMBODIMENTS

Figure 1:
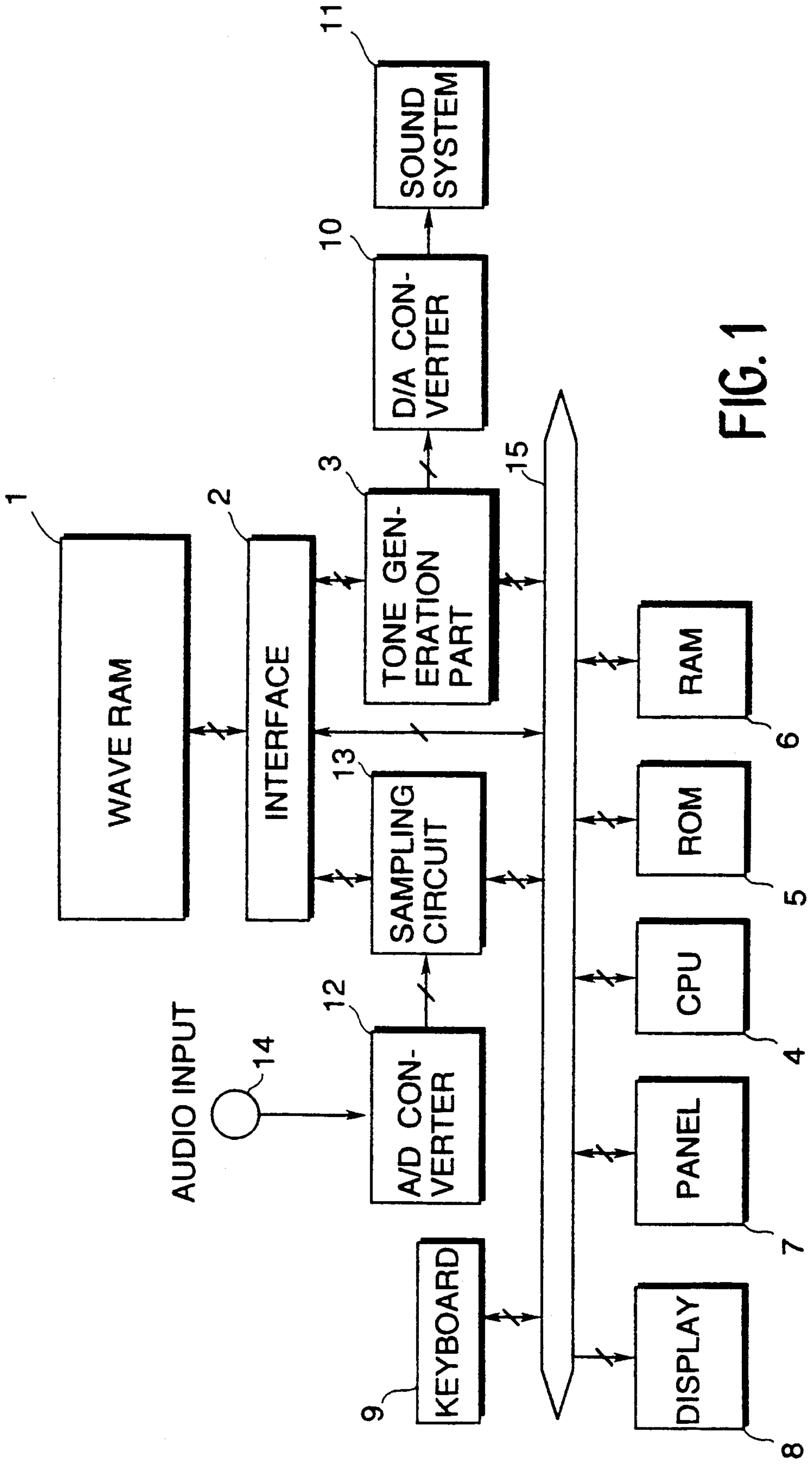
FIG. 1 is a block diagram of an electronic musical instrument having a tone generator embodying the present invention.

FIG. 1 is a block diagram of an electronic musical instrument having a tone generator embodying the present invention.

The tone generator is provided with a wave RAM 1 storing wave data, an interface 2, and a tone generation part 3 from which wave data is read and in which the wave data is mixed. The musical instrument is controlled by a CPU 4, and is provided with a ROM 5, a RAM 6, a panel switch 7, a display device 8 and a keyboard 9. The musical tone output data from the tone generation part 3 is supplied to a sound system 11 through a DA converter (digital analogue converter) 10. In this example, to store the wave data in a wave RAM I an AD converter 12 and a sampling circuit 13 is included in the tone generator. The musical tone signal inputted into an audio input terminal 14 is digitized at the AD converter 12, the digitized data is sampled at the sampling circuit 13, and the sampled data is developed in the RAM 6. After that, a basic wave data and a differential data are extracted, and the extracted data is stored in the wave RAM 1.

Figure 2:
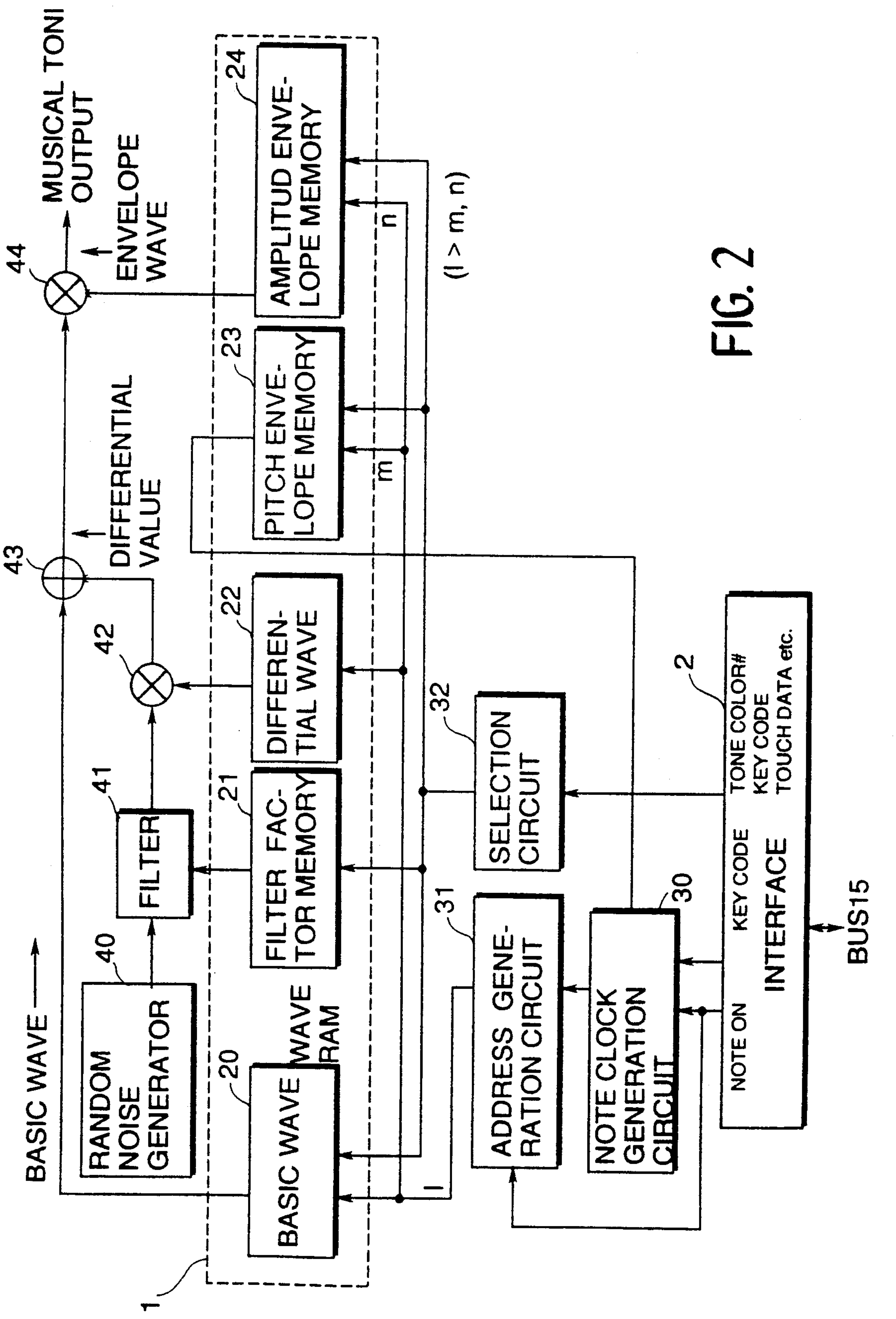
FIG. 2 is a block diagram of the tone generator.

FIG. 2 is a block diagram of the tone generator.

The wave RAM 1 comprises a basic wave memory 20, a filter factor memory 21, a differential wave memory 22, a pitch envelope memory 23 and an amplitude envelope memory 24. The basic wave memory stores basic wave data of the musical tone signal. The differential wave memory 22 stores differential data which represents difference between a basic wave data and another basic wave data. The filter factor memory 21 stores filter factors to a filter which filters output data from a random noise generator stated later. The pitch envelope memory 23 stores compression rates on a time axis to the output wave data from the basic wave memory 20 and the differential wave memory 22, that is, data for deciding clock speed to read wave data from each wave memory. The amplitude envelope memory 24 stores compression rates on a amplitude axis to the mixed data which is formed by mixing wave data read from each wave memory.

A note clock generation circuit 30, an address generation circuit 31 and a selection circuit 30 is connected between the wave RAM 1 and the interface 2. The note clock generation circuit 30 generates note clocks to the address generation circuit 31 based on the output data from the pitch envelope memory 23 when note on data and a key code is given from the CPU 4. The note clocks varies the cycle itself according to the data outputted from the pitch envelope memory 23. The address generation circuit 31 generates an address of each memory in the wave RAM 1 by counting the number of the note clocks, and then gives it to the wave RAM 1. When the tone generation part 3 is received a tone color number, a key code, touch data or the like from the CPU 4, the selection circuit 32 selects the wave data in the basic wave memory 20, the filter factor in the filter factor memory 21 and data in the pitch envelope memory 23 and the amplitude envelope memory 24. The upper m bits data and the lower n bits data out of 1 bits data outputted from the address generation circuit 31 are led to the address terminals of the pitch envelope memory 23 and the amplitude memory 24, respectively.

In this example, a random noise generator 40 which generates random noises to multiply the differential wave data outputted from the differential wave memory 22 by a random factor is provided. A filter 41 is also provided to filter the output data from the random noise generator 40. The filter factor for the filter 41 is supplied from the filter factor memory 21. The differential wave data is multiplied by the output data from the filter 41 by a multiplier 42, and then the multiplied data is mixed with the basic wave data by an adder 43. The added data is multiplied by envelope wave data outputted from the amplitude envelope memory 24 by a multiplier 44, the multiplied data being outputted to the DA converter 10 as musical tone data. It is possible that a release envelope memory is provided in the wave RAM 1, thereby generating release envelope wave data at the timing of keyoff and multiplying the release envelope wave data by the output data from the multiplier 44. It is also possible that the output data from the adder 43 is multiplied by 1/(1+ the differential data), resulting in that change of the tone volume depending on level displacement of the differential data can be canceled.

Figure 3:
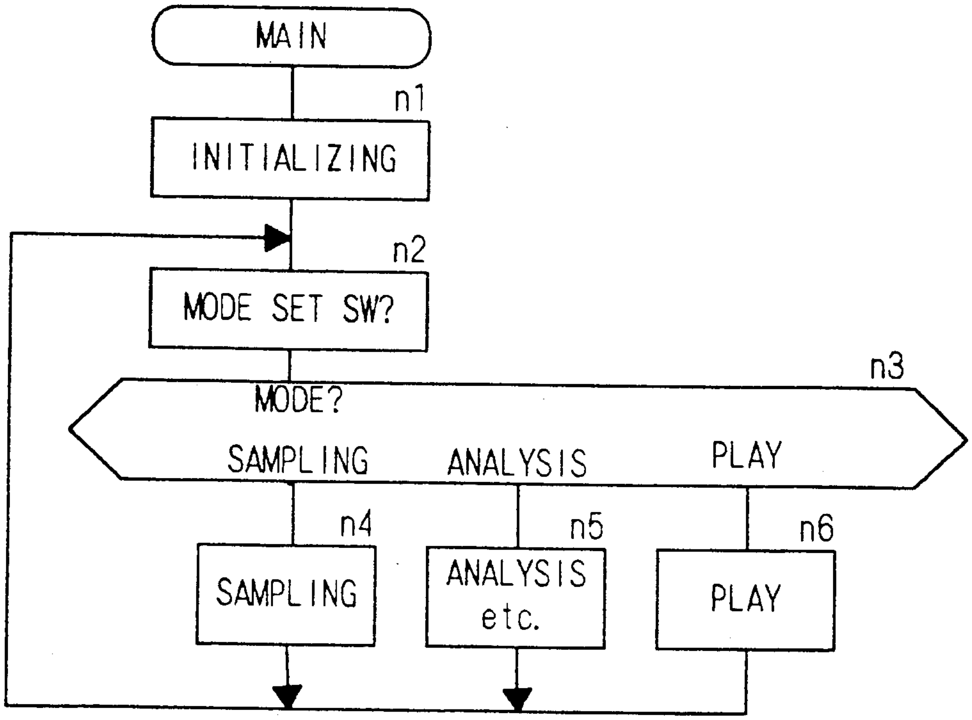
FIGS. 3(A) to 3(E) are flow charts showing processes of a CPU.
Figure 3:
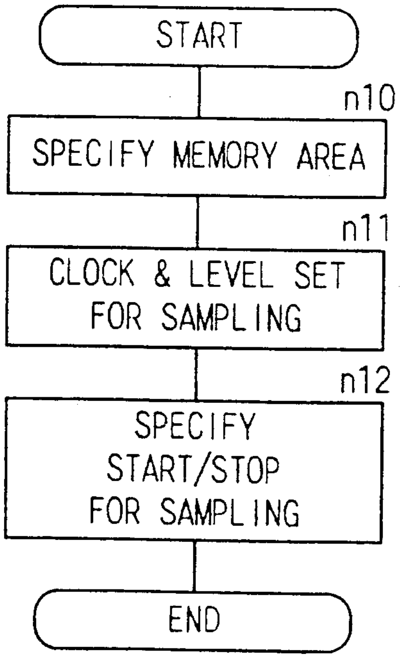
Figure 3C:
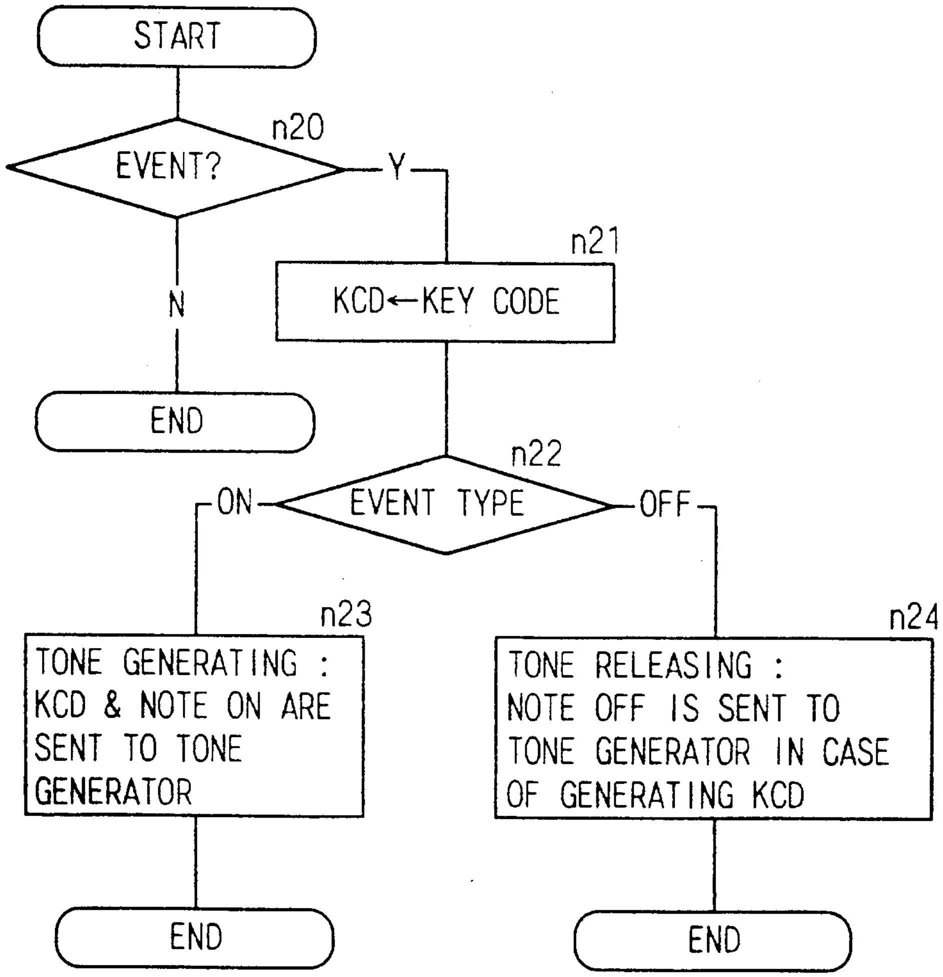
Figure 3D:
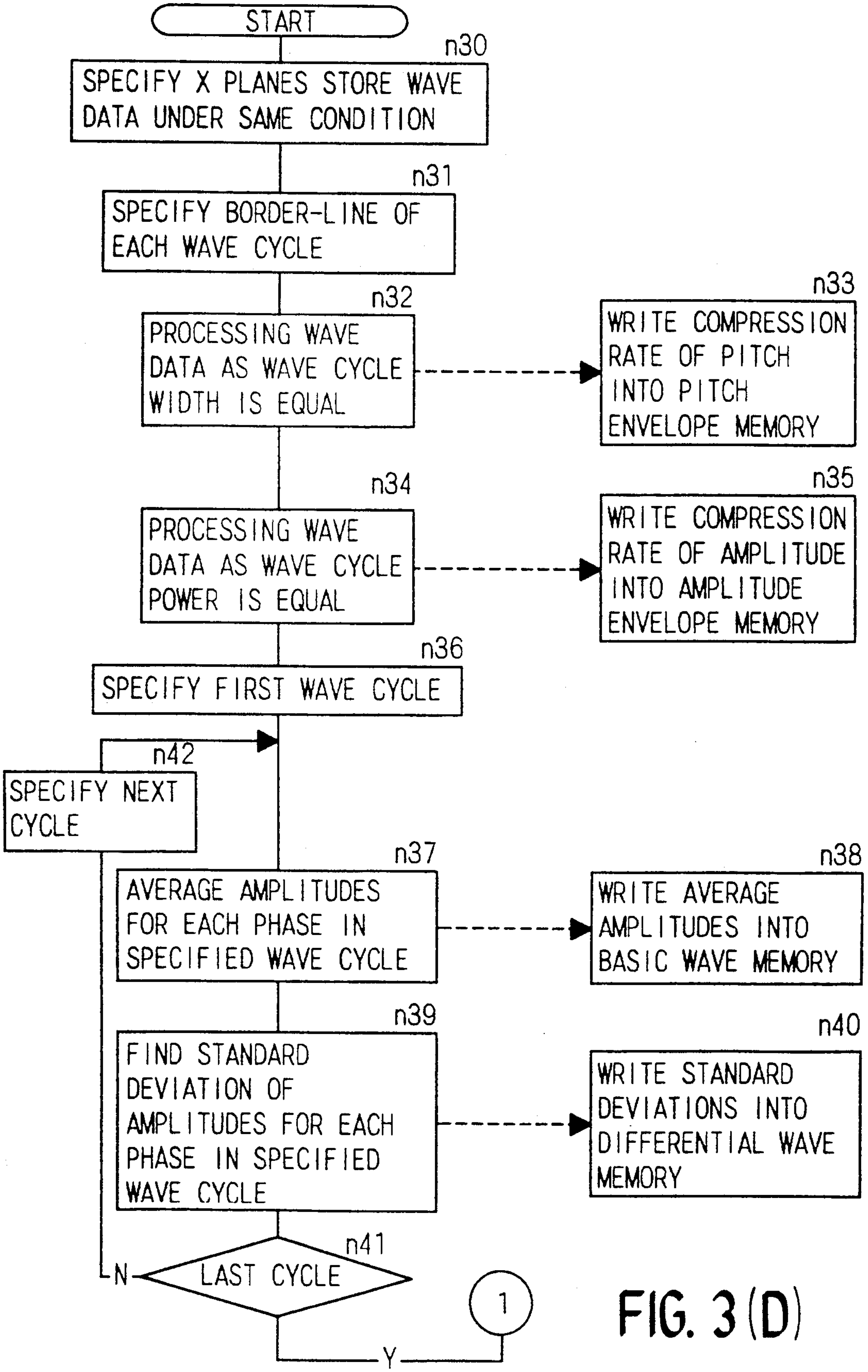
Figure 3E:
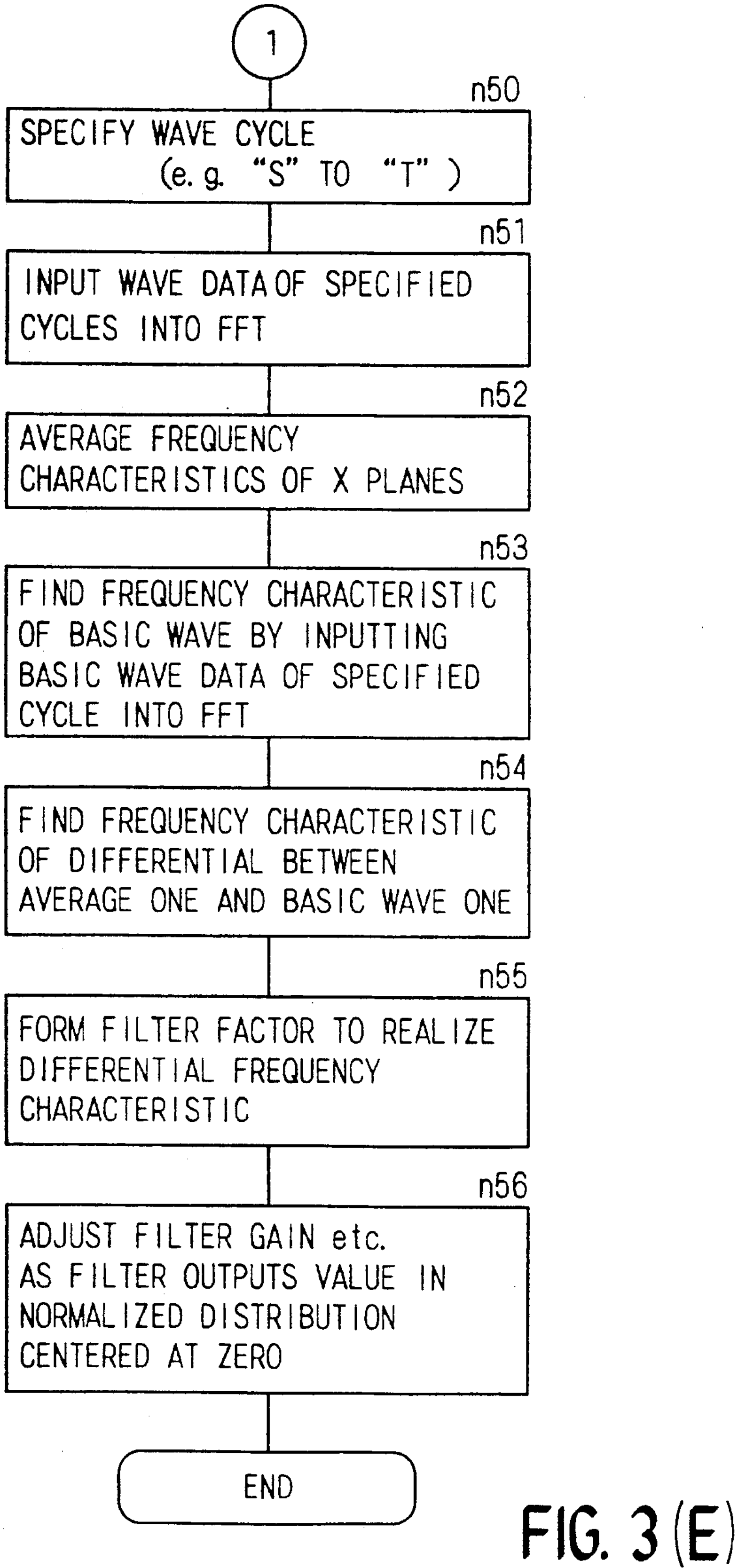

Referring to FIG. 3, the following is a description of the operation of the electronic musical instrument.

In place of direct sampling of the basic wave, in this example, sampling wave data of some musical tone signals each of which is similar is stored in X planes of memory, the basic wave data being decided depending on an average of the stored sampling wave data. The differential wave data is given with variation of each wave data. Another wa is that after being sampled two or more basic wave, the differential wave data is found based on the sampled basic wave data.

FIG. 3 (A) is a flow chart showing a main process of the CPU 4.

After the system is initialized (n1), a mode setting switch on the panel switch 7 is scanned (n2) to decide a present mode (n3). If the present mode is a sampling mode in which musical tone signals inputted into the audio input terminal 14 is sampled, the process goes to step n4. If the present mode is a mode to analyze the sampled wave data, the process goes to step n5. Otherwise, if the present mode is a play mode, the process goes to step n6.

FIG. 3 (B) is a flow chart showing the sampling process.

In this mode, musical tone signals of a natural musical instrument, such as a piano, is inputted into the audio input terminal 14 through a microphone or the like. At step n10, a writing area is specified in the wave RAM I. Next, the sampling clock cycle and the level and so on at the sampling circuit 13 are set (n11). After the above-mentioned preparation is carried out, the sampling mode is started, that is, the sampling circuit 13 starts to sample the inputted musical tone signals, the sampled data is stored in the RAM 6. When the sampling process is carried out for the specified cycle, the sampling process is stopped by instruction of a performer.

FIG. 3 (C) is a flow chart showing the play mode process.

In this mode, a key-on or a key-off of the keyboard is decided by event detection. If any event is detected at n20, the key code corresponding the detected event is set into a resister KCD (n21), and then the event type is judged (n22). If the event type is on event, tone generation process is started (n23), that is, the key code and the note on data is outputted to the tone generator. If the event type is off-event, the process goes to step n24 to release tone generation. In the release tone process, if the key code of the detected off-event is in tone generation, note off data is outputted to the tone generator.

FIG. 3 (D) is a flow chart showing a process in the analysis mode.

In this process, the basic wave data and the differential wave data is extracted from the sampling wave data of the musical tone signals stored in the RAM 6, and then the extracted data is stored into the basic wave memory 20 and the differential wave memory 22. Also, the filter characteristics is decided, and the factors to realize the characteristics are calculated to store them into the filter factor memory 21.

Figure 4:
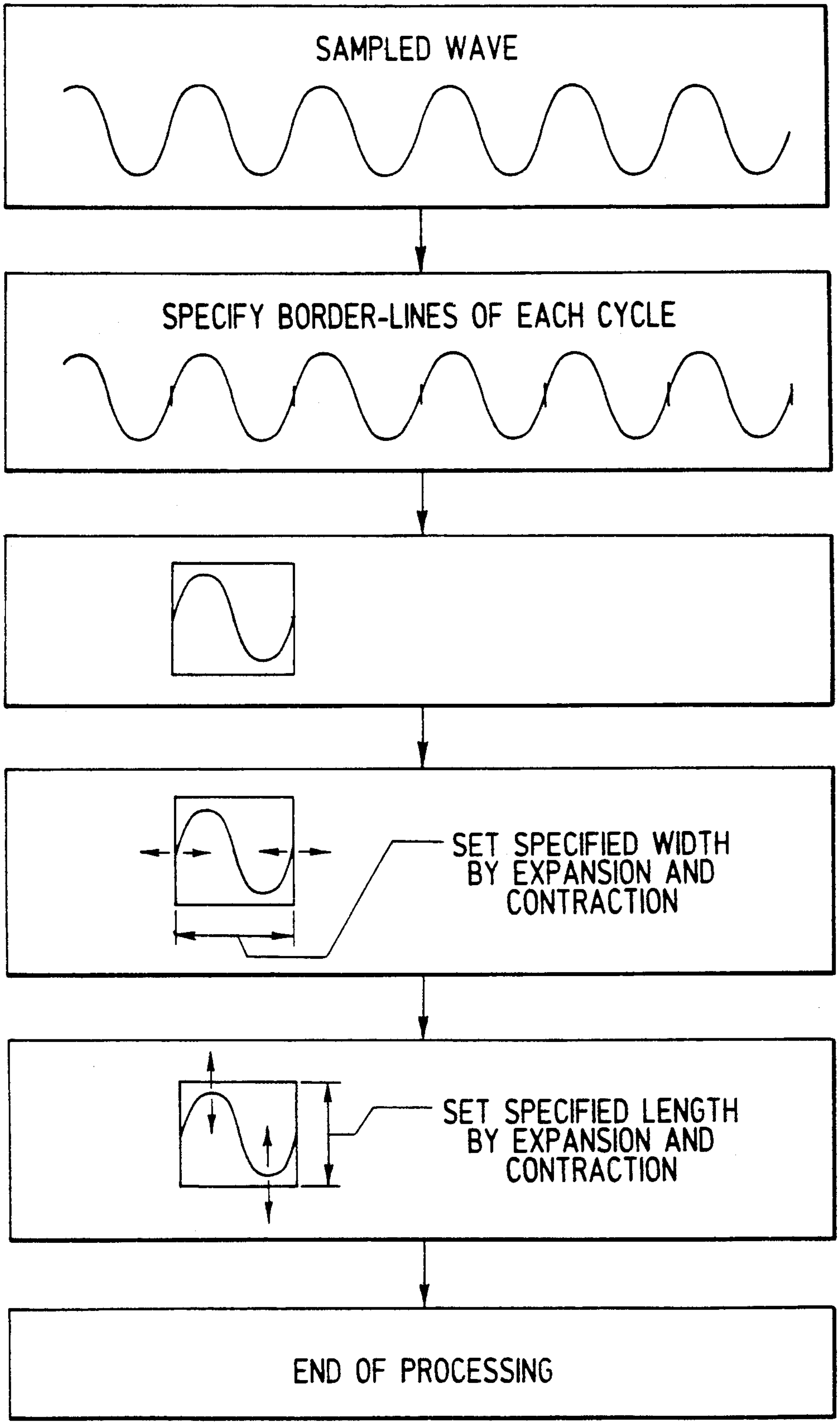
FIG. 4 and FIG. 5 illustrate the process of the CPU.

First, the memory planes in which X pieces of the sampling wave data generated under the same condition is stored are specified (n30). Next, the border-line of each cycle wave of the sampling wave data stored in each memory of the X planes is specified (n31). That's why the border-line of each sampling wave data is usually not clear. The sampling wave data of each of X memory planes is processed so that the border-line of each sampling wave data forms a fixed interval for each wave cycle. This means that any pitch is deleted and the the phase of basic wave is matched. Then, the compression rate of each cycle width in this wave process is found, the each compression rate being stored into the pitch envelope memory 23 (n33). Further, the wave data is processed so that the wave power of every specified cycle is a fixed value by compressing the amplitude of the wave, the compression rate of each amplitude in this wave process being stored into the amplitude envelope memory 24 (n35). FIG. 4 illustrates the wave process of step n30 to step n35. The compression rate stored in each memory at step n33 and step n35 is, for example, a compression rate for typical wave data out of the wave data stored in each memory of X planes, or a average compression rate for every wave data.

After the above-mentioned process is carried out, the data to be stored into the basic wave memory 20 and the differential wave memory 22 is decided. Initially, the first cycle for every thus processed wave is specified. The above-processed wave data is kept in the RAM 6 to use it when the filter characteristics is decided as stated later. Next, the amplitude values of all ( X pieces ) thus processed wave data are averaged for each phase in the specified cycle (n37). Then, the averaged amplitude value for each phase is successively stored into the basic wave memory 20 for every wave cycle (n38). Next, the standard deviation of the amplitude values of all ( X pieces ) thus processed wave data is found for each phase in the specified cycle (n39). Then, the found standard deviation value for each phase is successively stored into the differential wave memory 24 for every wave cycle (n40).

The above steps from n37 to n40 are continued till the last cycle is ended (n41, n42), resulting in that the basic wave data and the differential wave data are stored, respectively.

FIG. 3 (E) is a flow chart showing a setting routine of the filter characteristics.

Figure 5:
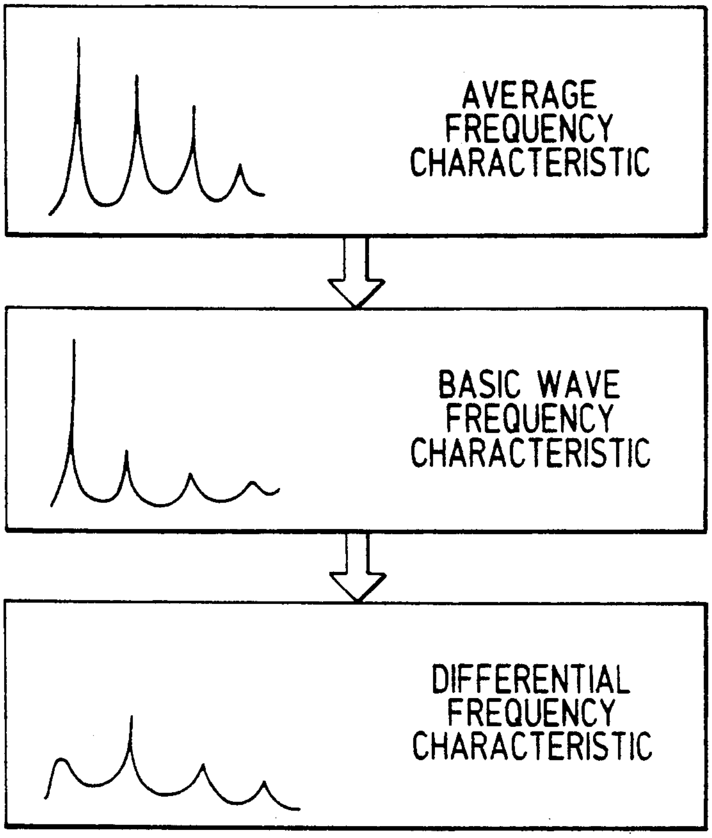
Figure 6:
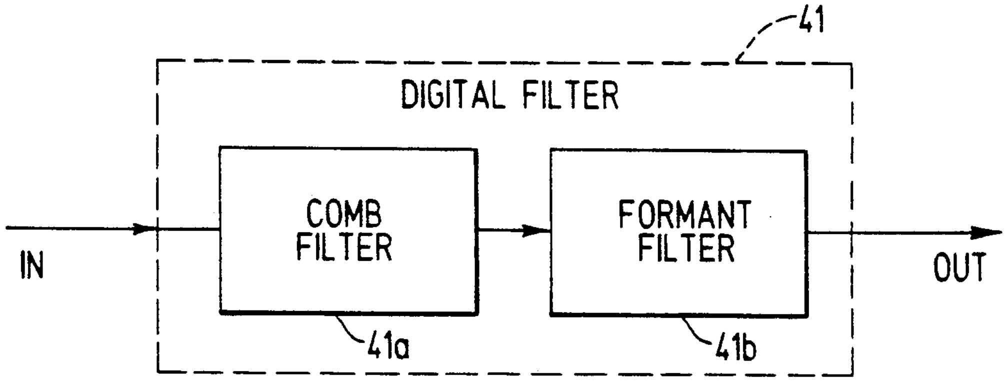
FIG. 6 is a block diagram of an example of a filter.

First, the wave cycle for making the filter factor is specified (n50), and then, the specified wave cycle's one of the processed wave data in the X memory planes obtained by the steps from step n30 to step n35 is inputted into an FFT (First Fourier Transform) analysis device to obtain frequency characteristics. Next, the obtained frequency characteristics for the wave data of the X memory planes are averaged to obtain an average frequency characteristic (n52). Furthermore, the specified wave cycle's one of the processed wave data stored in the basic wave memory 20 is inputted into the FFT analysis device to obtain a basic wave frequency characteristic (n53). Next, the difference between the average frequency characteristic and the basic wave frequency characteristic is calculated to obtain a differential frequency characteristics (n54), thereby the filter factor to realize the differential frequency characteristics being produced (n55). That is, the filter factor is produced so that the frequency characteristic of the filter 41 is the same as the frequency characteristic of the differential wave data read from the differential wave memory 22. Next, the adjustment of the filter gain or the like is performed so that the filter outputs values with a probability of normalized distribution centered at zero (n56). This step results in that the output data of the multiplier 42 becomes random varying wave data by multiplying the differential wave data with the random factor, however, in view of more width time than specified time, the average of the random factors equals zero, resulting in that the average of the output data of the multiplier 42 equals zero. FIG. 5 illustrates a process of steps from n52 to n54, and FIG. 6 is a block diagram of an example of the filter 41. As shown in the FIGURE, the filter is formed with a digital filter combined a comb filter with a formant filter. The comb filter 41*a* is tuned at the basic wave pitch. The formant filter 41*b* comprises band-pass filters to realize the formant characteristic connected parallel.

According to the above-mentioned process, the wave data different from the basic wave data which is obtained by adding the basic wave data read from the basic wave memory 20 and the differential wave data read from the differential wave memory 22 is outputted. As the differential wave data is slightly modulated by the noises in normalized distribution centered at zero, the outputted musical tone color varies delicately, but the tone color, as a whole, resembles one of the basic wave data.

In this example, the primary differential wave is added to the basic wave. It is available to add the secondary differential wave to the basic wave, resulting in that a right side probability distribution and a left side one become unsymmetrical.

According to the tone generator, as the wave data is formed by mixing the basic wave data in the basic wave memory and the differential wave data in the differential wave memory, a wave memory to store the all wave data is unnecessary, and the differential wave memory allows the amount of one to be small; therefore the amount of whole memory can be small. Further, the wave data whose tone color varying at random can be easily obtained by multiplying the differential wave data by the random factors which become averagely to zero, and as the average of the random factors in more time width than a specified time equals zero, the basic wave tone color can be obtained as a whole. Further, it is able to make delicate varies to the wave data by multiplying the random factors, so that thick and spread musical tone can be produced.

What is claimed is:

1. A tone generator comprising:

a basic wave memory for storing first basic wave data of a musical tone signal;

a differential wave memory for storing differential wave data which is different from the first basic wave data, the differential wave data representing fluctuations in widths of musical tone waves corresponding to the first basic wave data;

a random noise generator for generating random noises for use as factors for altering the differential wave data;

a multiplier for multiplying the differential wave data in accordance with the random noises generated by the random noise generator;

filter means for filtering the random noises; and filter coefficient memory means for storing filter coefficients which render a frequency characteristic of the filter equal to a frequency characteristic of the differential wave data and render an average value of an output of the filter means equal to zero;

mixing means for mixing the first basic wave data and the differential wave data; and output means for outputting data mixed by the mixing means and generating tones.

2. A tone generator according to claim 1, wherein the filter means includes a combination of a comb filter tuned to a basic wave pitch and a second filter including a plurality of band-pass filters to realize a predetermined filter characteristic.

3. A tone generator comprising;

a first wave memory for storing first wave data of a musical tone signal;

a second wave memory for storing second wave data representing fluctuations in widths of musical tone waves corresponding to the first wave data;

first reading means for reading the first wave data from said first wave memory;

second reading means for reading the second wave data from the second wave memory;

random signal generation means for generating a random signal; and imparting means for imparting fluctuations to the first wave data read by the first reading means and outputting the fluctuation imparted wave data as musical tone data, wherein the fluctuations vary randomly with time and the fluctuations have characteristics controlled according to the second wave data read by the second reading means.

4. A tone generator according to claim 3, wherein the imparting means includes:

a random signal generator for generating a random signal in accordance with the additional wave data;

adding means for adding the random signal to the first wave data to obtain the fluctuation imparted wave data.

5. A tone generator according to claim 3, wherein one characteristic of the fluctuation controlled by the second wave data is an envelope of the fluctuation.

6. A tone generator according to claim 3, wherein the second wave data controls a frequency spectrum of the fluctuations.

7. A tone generator according to claim 3, wherein a value of the fluctuation imparted wave data has a probability distribution equal to natural wave data sampled from real sound of natural instruments.

8. A tone generator according to claim 3, wherein phase positions of the first wave data stored in the first wave memory correspond to phase positions of the second wave data stored in the second wave memory, the tone generator further including a common address generator, the common address generator being utilized by the first and second reading means in reading the first and second wave data from the first and second wave data memories.

9. A tone generator method comprising the steps of:

storing first wave data of a musical tone signal in a first memory;

storing second wave data representing fluctuations in widths of musical tone waves corresponding to the first wave data in a second memory;

reading the first wave data from said first wave memory;

reading the second wave data from the second wave memory;

generating a random signal; and imparting fluctuations to the first wave data read and outputting the fluctuations imparted wave data as musical tone data wherein characteristics of the random signal are controlled according to the second wave data.

* * * * *